United States Patent
Teramoto

(10) Patent No.: US 9,185,836 B2
(45) Date of Patent: Nov. 10, 2015

(54) DISPLAY DEVICE AND METHOD OF MANUFACTURING THE SAME

(71) Applicant: MITSUBISHI ELECTRIC CORPORATION, Tokyo (JP)

(72) Inventor: Hiroshi Teramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/139,787

(22) Filed: Dec. 23, 2013

(65) Prior Publication Data

US 2014/0177147 A1 Jun. 26, 2014

(30) Foreign Application Priority Data

Dec. 26, 2012 (JP) ................. 2012-282039

(51) Int. Cl.
| | |
|---|---|
| H05K 1/02 | (2006.01) |
| H05K 13/00 | (2006.01) |
| H05K 7/02 | (2006.01) |
| G02F 1/1333 | (2006.01) |
| G02F 1/1345 | (2006.01) |

(52) U.S. Cl.
CPC ............ *H05K 13/00* (2013.01); *G02F 1/13452* (2013.01); *G02F 1/133308* (2013.01); *H05K 7/02* (2013.01); *G02F 1/13338* (2013.01); *G02F 2001/133314* (2013.01); *Y10T 29/49002* (2015.01)

(58) Field of Classification Search
CPC ................. G06F 1/1652; H05K 2201/10128; H05K 13/00; H05K 1/115; H05K 2201/10446; H05K 9/0007; H05K 7/02; Y10T 29/49002; G02F 1/13338; G02F 2001/133313
USPC ............ 361/679.22, 679.01, 679.02, 679.21, 361/679.26, 679.27, 749; 349/58–60; 29/592.1

See application file for complete search history.

(56) References Cited

U.S. PATENT DOCUMENTS

| | | | |
|---|---|---|---|
| 2010/0053049 A1 | 3/2010 | Sato et al. | |
| 2011/0187960 A1* | 8/2011 | Kobayashi et al. | ............. 349/58 |
| 2012/0008062 A1 | 1/2012 | Jeong et al. | |

FOREIGN PATENT DOCUMENTS

| | | |
|---|---|---|
| JP | 2010-060862 A | 3/2010 |
| JP | 2012-018401 A | 1/2012 |

* cited by examiner

*Primary Examiner* — Anthony Haughton
*Assistant Examiner* — Ingrid Wright
(74) *Attorney, Agent, or Firm* — Studebaker & Brackett PC

(57) ABSTRACT

A first rear member is arranged on a rear surface of a display member. A second rear member has a shape surrounding a side surface of the first rear member. The second rear member is attached from a rear surface side of the first rear member to house the first rear member. An interconnect member connected to the display member extends between the side surface of the first rear member and the second rear member. An end portion of the interconnect member is inserted in an insertion part having an opening formed in the side surface of the first rear member. A condition where the interconnect member is inserted in the first rear member is maintained before and after attachment of the second rear member.

12 Claims, 16 Drawing Sheets

F I G . 1 7
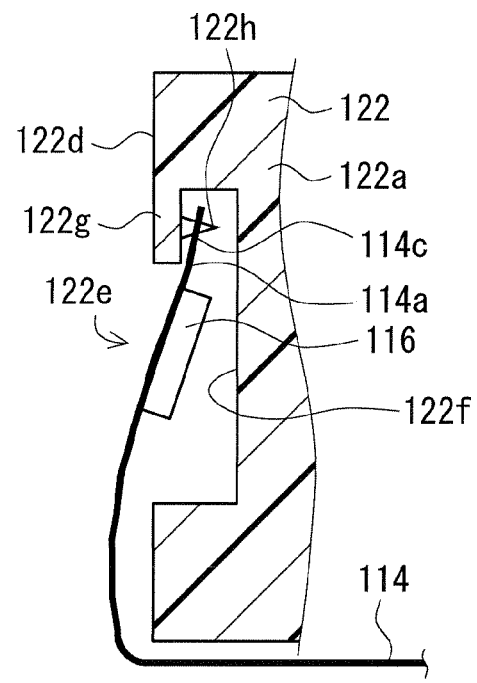
F I G . 1 8
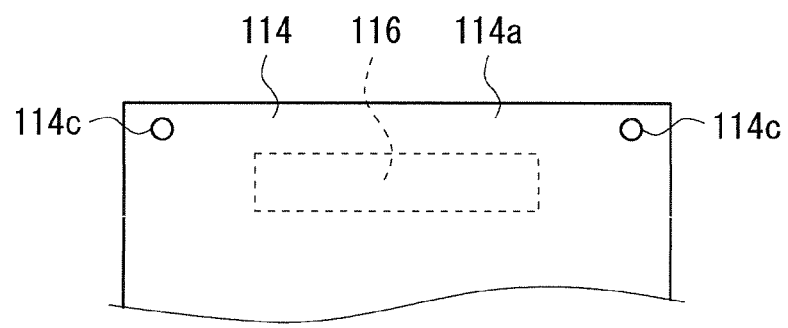

DISPLAY DEVICE AND METHOD OF MANUFACTURING THE SAME

FIELD OF THE INVENTION

The present invention relates to a display device and a method of manufacturing the same.

BACKGROUND ART

According to a known structure of some conventional display device, a touch panel or a protective member (hereinafter called the touch panel or the like) is bonded to a display surface of a display panel to integrate the display panel and the touch panel or the like. More specifically, the touch panel or the like is bonded so as to cover an area from the display surface to the front surface of a casing with a sheet-like adhesive material. Such bonding or integration may be called glass bonding in some cases.

A step determined by the thickness of the casing at an opening edge portion thereof is generated at a boundary between the display surface and the opening edge of the casing. Hence, air bubbles may be generated easily in an adjacent area of the step during bonding of the adhesive material. In order to cancel this step, a thick adhesive material is used, or a plurality of adhesive materials is stacked.

There has also been a structure where a backlight unit is mounted on the rear surface of a display panel to which the touch panel or the like is bonded in advance, and a casing covers the display panel from its rear surface so as to house the backlight unit. The casing has a planar part facing a peripheral part of the touch panel or the like and extending parallel to this peripheral part. This planar part is bonded to the peripheral part of the touch panel or the like. This can reduce the used amount of an adhesive material and realize bonding work more simply.

Japanese Patent Application Laid-Open No. 2012-18401 describes a technique intended to slima liquid crystal display device. More specifically, a circuit film connecting a liquid crystal panel and a printed circuit board extends toward the printed circuit board while passing through a space between the inner wall of a molded frame of a backlight assembly and an optical sheet of the backlight assembly. The molded frame has a groove in order to allow the circuit film to pass through the space without being interfered by the molded frame.

Japanese Patent Application Laid-Open No. 2010-60862 describes a technique intended to reduce the width of a bezel of a liquid crystal display device. More specifically, a gate COF (chip on film) is mounted on a liquid crystal panel. The gate COF is housed in a frame surrounding the liquid crystal panel. This frame has an opening area where the gate COF is inserted. Further, a lid is provided to cover the gate COF inserted in this opening area.

The gate COF of Japanese Patent Application Laid-Open No. 2010-60862 is connected to the liquid crystal panel while it is not connected to a substrate corresponding to the printed circuit board of Japanese Patent Application Laid-Open No. 2012-18401. Such connection is called "connection without substrate" or simply, "without substrate."

Generally, the COF without substrate projects outwardly of a display panel and extends parallel to a surface of the display panel. This results in troublesome work of housing the COF without substrate in the aforementioned casing that covers the backlight unit from its rear surface side, for example. Depending on circumstances, the COF might be caught between the casing and the touch panel or the like.

The catch of the COF may be prevented for example by fixing the COF to the backlight unit with an adhesive member such as tape before attachment of the casing. However, this necessitates additional work, which is not preferable. This also generates the fear of disconnection of a mounting portion due to removal of the tape for disassembly of the display device for repair, for example.

In the aforementioned structure of Japanese Patent Application Laid-Open No. 2012-18401, the circuit film passes inside the backlight assembly. This might generate problems such as local nonuniformity of backlight brightness and leakage of backlight. These problems may also apply to the structure where the groove for passage of the circuit film is formed in the molded frame.

The aforementioned structure of Japanese Patent Application Laid-Open No. 2010-60862 necessitates a complicated shape and a complicated structure for the frame to house the gate COF. This leads to problems such as reduction in yield and cost increase.

SUMMARY OF THE INVENTION

The present invention relates to a display device including an interconnect member connected in what is called a "connection without substrate" manner, and is intended to provide a technique that enhances working efficiency in manufacture and disassembly of the display device.

A display device according to an aspect of the present invention includes a display member, a first rear member, a second rear member, and an interconnect member. The first rear member is arranged on a rear surface of the display member. The second rear member has a shape surrounding a side surface of the first rear member. The second rear member is attached from a rear surface side of the first rear member to house the first rear member. The interconnect member is connected to the display member. The interconnect member extends between the side surface of the first rear member and the second rear member. An end portion of the interconnect member is inserted in an insertion part having an opening formed in the side surface of the first rear member. The end portion is away from the display member. A condition where the interconnect member is inserted in the first rear member is maintained before and after attachment of the second rear member.

According to the aforementioned aspect, the condition where the interconnect member is inserted in the first rear member is maintained during attachment of the second rear member. This prevents the interconnect member from getting snagged on the second rear member, thereby enhancing working efficiency. This also prevents the interconnect member from being caught between the second rear member and a different member, so that damage on the interconnect member or the like is prevented. Further, compared to the case where the interconnect member is bonded to the first rear member with an adhesive member such as tape, cost for the adhesive member is not required and reduction of working efficiency due to handling of the adhesive member is prevented. Additionally, the condition where the interconnect member is inserted in the first rear member is still maintained after attachment of the second rear member. This prevents collision of the interconnect member with the first rear member or the like due to shake of the interconnect member. Additionally, when the display device is to be disassembled for repair, for example, disconnection is prevented that might be generated at a mounting portion of the interconnect member during removal of the aforementioned adhesive member.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a sectional view schematically showing a display device of a fourth preferred embodiment;

FIG. 18 is a plan view schematically showing an interconnect member of the fourth preferred embodiment;

EMBODIMENT FOR CARRYING OUT THE INVENTION

First Preferred Embodiment

Figure 1:
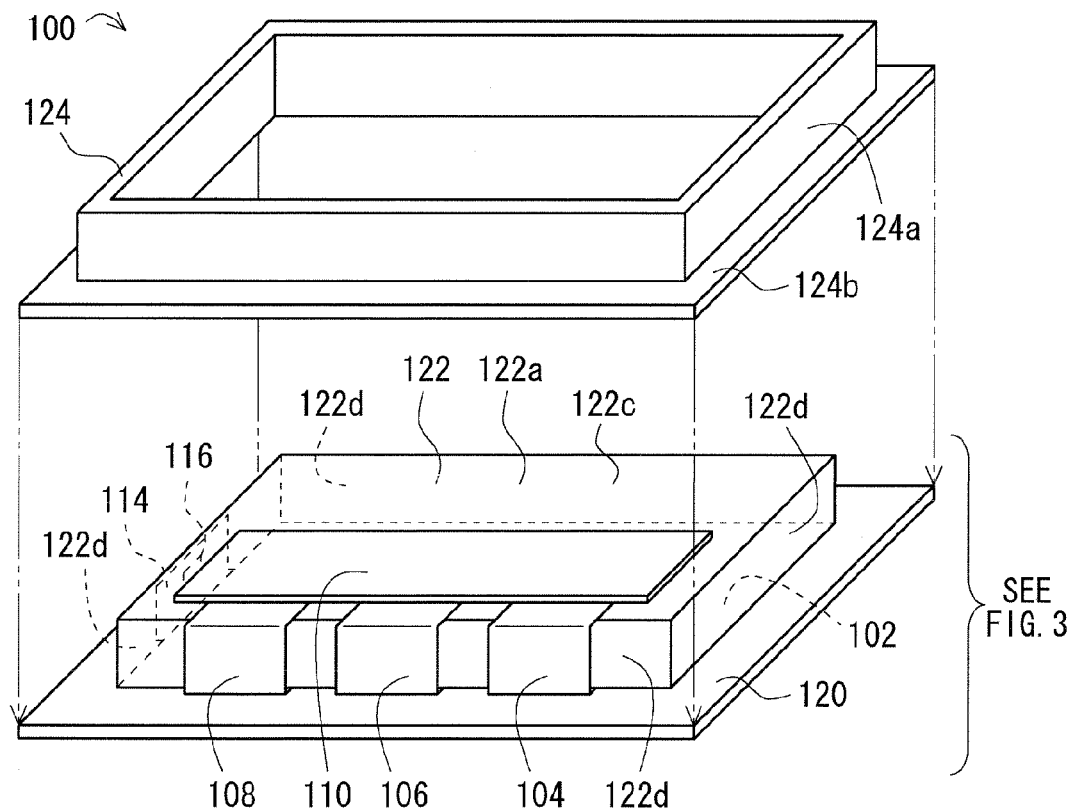
FIG. 1 is an exploded perspective view schematically showing a display device of a first preferred embodiment.
Figure 2:
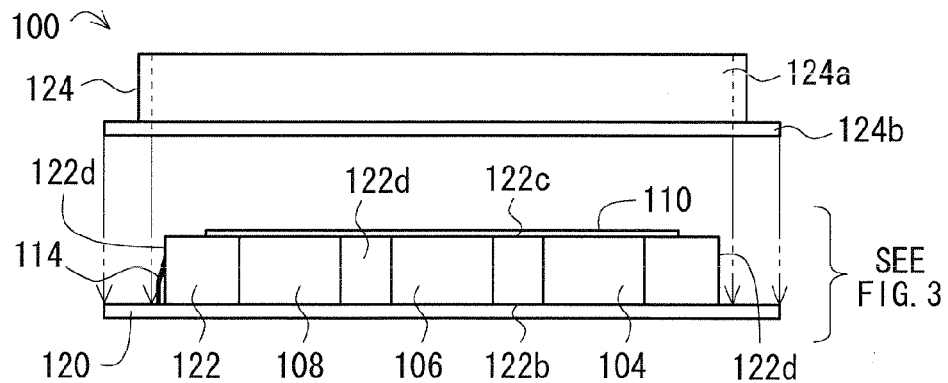
FIG. 2 is an exploded side view schematically showing the display device of the first preferred embodiment.
Figure 3:
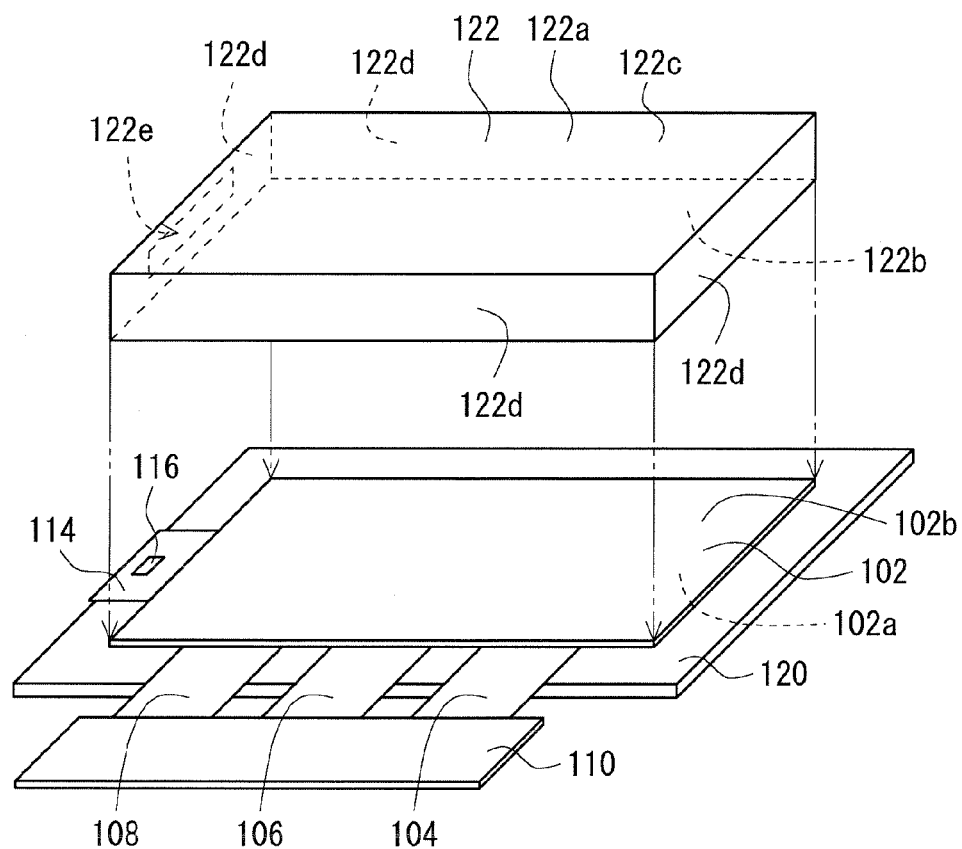
FIG. 3 is an exploded perspective view schematically showing the display device of the first preferred embodiment.
Figure 4:
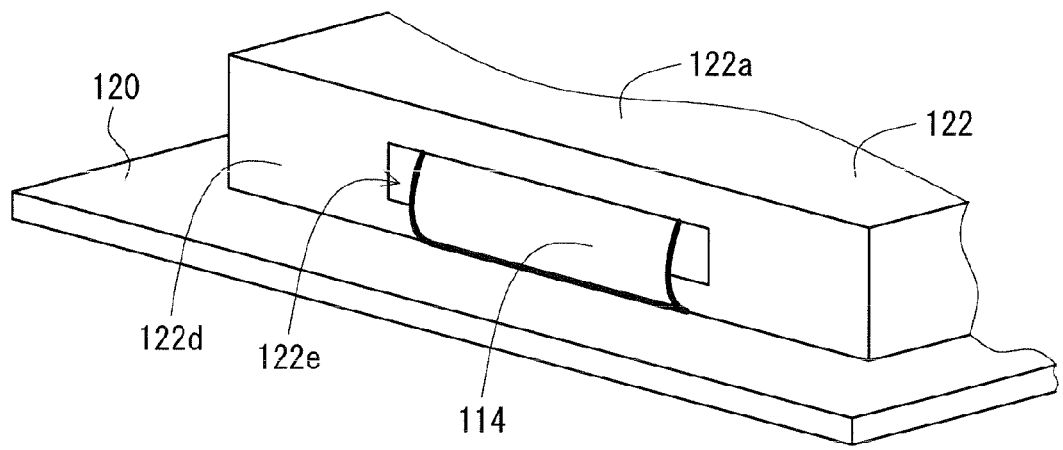
FIG. 4 is a perspective view schematically showing the display device of the first preferred embodiment.
Figure 5:
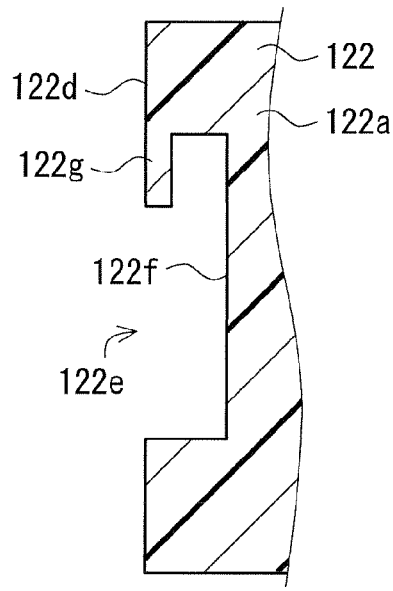
FIGS. 5 and 6 are sectional views each schematically showing the display device of the first preferred embodiment.
Figure 6:
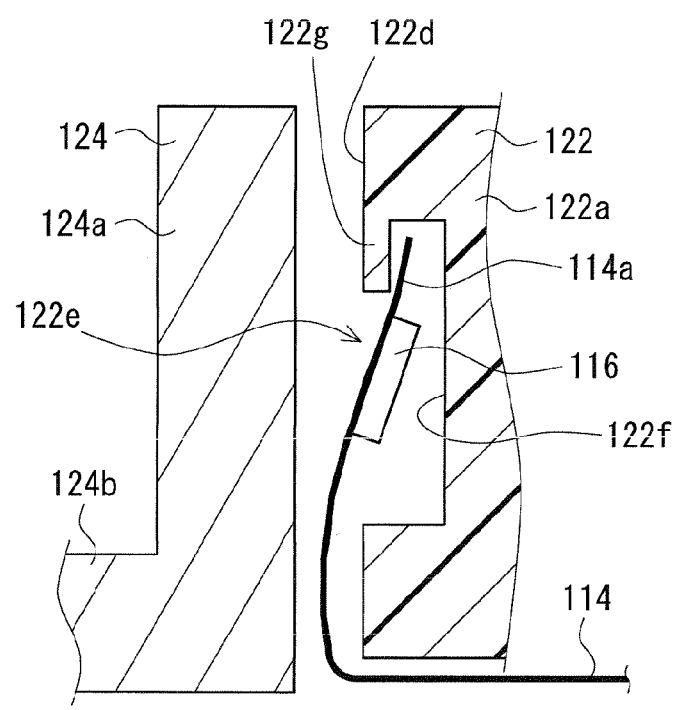

FIGS. 1 to 6 schematically show a display device 100 of a first preferred embodiment. FIGS. 1 and 3 are exploded perspective views, and FIG. 2 is an exploded side view corresponding to FIG. 1. FIGS. 4 to 6 show parts extracted from the display device 100: FIG. 4 is a perspective view, and FIGS. 5 and 6 are sectional views. In the example shown in FIGS. 1 to 6, the display device 100 includes a display member 102, interconnect members 104, 106 and 108, a circuit board 110, an interconnect member 114, a mounted element 116, a front member 120, a first rear member 122, and a second rear member 124. The display device 100 may include different members.

Here, a liquid crystal panel is shown as an example of the display member 102, and the display member 102 will also be called a liquid crystal panel 102 in some cases. The display member 102 may also be a display panel of a different type (such as a plasma display panel or an organic electroluminescence (EL) panel).

The liquid crystal panel 102 takes advantage of the birefringence of liquid crystal. In the display device 100, the specifications of the liquid crystal panel 102 are not particularly limited. The liquid crystal orientation control system of the liquid crystal panel 102 may be a TN (twisted nematic) system, an IPS (in-plane switching) system, or a VA (vertical alignment) system, for example.

The liquid crystal panel 102 is composed of a first substrate and a second substrate bonded together. The first substrate includes an insulating substrate made for example of glass, and a colored layer, a light-shielding layer, an opposite substrate, an orientation film and the like formed on the insulating substrate. The second substrate includes an insulating substrate made for example of glass, and a thin film transistor (hereinafter also called a TFT) functioning as a switching element, a pixel electrode and the like formed on the insulating substrate. According to the IPS system, for example, both the pixel electrode and the opposite electrode are formed in the second substrate. The first and second substrates are bonded via a seal member provided around the substrates. Liquid crystal is arranged between the first and second substrates. A spacer to maintain a gap between the first and second substrates is arranged between these substrates. If liquid crystal is to be injected by dipping injection process, the aforementioned seal member is cut at one or more places, and the cut part of the seal member provides an inlet for the liquid crystal. This inlet is sealed with a sealant after the liquid crystal is injected. Liquid crystal dropping process does not require the cut part of the seal member, so that a sealant to fill the inlet is made unnecessary. Further, polarizing plates are arranged on the outer surfaces of the first and second substrates.

The interconnect members 104, 106 and 108 connect the liquid crystal panel 102 and the circuit board 110. As an example, the interconnect members 104, 106 and 108 are FPCs (flexible printed circuits) having flexibility. This can bend the interconnect members 104, 106 and 108 to arrange the circuit board 110 on the first rear member 122, as shown in the example of FIG. 1.

The circuit board 110 is a circuit module attached externally to the liquid crystal panel 102. Here, the circuit board 110 includes a PCB (printed circuit board) and various elements (not shown in the drawings) mounted on the PCB. As an example, the circuit board 110 includes a signal processing circuit to generate a source signal (to be supplied to a TFT of a pixel targeted for writing). In this case, the circuit board 110 is connected to a source terminal of the liquid crystal panel 102 via the interconnect members 104, 106 and 108.

The interconnect members 104, 106 and 108 can be connected to the liquid crystal panel 102 by soldering or via a connector, for example. The interconnect members 104, 106 and 108 can be connected to the circuit board 110 in the same way. While the three interconnect members 104, 106 and 108 are shown as an example, the number of interconnect members connecting the liquid crystal panel 102 and the circuit board 110 is not limited to three.

The interconnect member 114 is connected to the liquid crystal panel 102. The interconnect member 114 can be connected to the liquid crystal panel 102 by soldering or via a connector, for example. Unlike the interconnect members 104, 106 and 108, the interconnect member 114 is not connected to an external substrate corresponding to the circuit board 110. Such connection is called "connection without substrate" or simply, "without substrate." As an example, the interconnect member 114 is an FPC having flexibility. This can bend the interconnect member 114 so that the interconnect member 114 can extend along the first rear member 122, as shown in the example of FIGS. 4 and 6. The interconnect member 114 will be described in more detail later.

The mounted element 116 is mounted on the interconnect member 114. Here, the mounted element 116 is an IC (integrated circuit), for example, and the mounted element 116 will also be called an IC 116 in some cases. In this example, the IC 116 and the interconnect member 114 form what is called a COF (chip on film). As an example, the IC 116 includes a signal processing circuit to generate a gate signal (to be supplied to a TFT of a pixel targeted for writing). The mounted element 116 is not limited to an IC.

The front member 120 is arranged on a front surface 102a (surface from which a display screen is viewed) of the liquid crystal panel 102. The front member 120 is a touch panel, for example. The touch panel includes a circuit composed a transparent electrode formed on a transparent substrate. This circuit detects the coordinates of a position where an operator touched on a touch-sensitive surface. Information about a result of the detection is transmitted as an electric signal to a control circuit. Here, a projected capacitive touch panel is employed as an example. The projected capacitive system measures a ratio between the amount of current at a position of contact by a fingertip or the like and the amount of current detected by a plurality of electrode patterns existing near the contact position. Thus, the projected capacitive system is capable of precisely determining a position of contact for example by a fingertip. The touch panel is composed of an upper substrate and a lower substrate made for example of transparent glass.

The front member 120 may include a protective member in addition to or instead of the touch panel. The protective member is arranged on the front surface of the touch panel or the liquid crystal panel 102, and prevents generation of damage, deformation, abrasion, contamination and the like due to external contact with the touch panel and the liquid crystal panel 102 or external pressure on the touch panel and the liquid crystal panel 102. The protective member is made of a generally transparent material such as glass or plastic. According to an environment where the display device 100 is to be used, glass, which is strong and hard to deform, is used, for example. Further, if the protective member is thicker than the touch panel, more specifically, if the thickness of the protective member is about twice or more the thickness of the touch panel, for example, deformation or damage is prevented effectively. The protective member may be given a value in terms of design by giving printing or coating to the front or back surface of the protective member, for example.

In the example shown in the drawings, the front member 120 is larger than the liquid crystal panel 102, and the liquid crystal panel 102 is arranged to face the front member 120 so as not to go out of range of the front member 120. The front member 120 and the liquid crystal panel 102 are integrated by adhesively connecting a surface of the front member 120 and that of the liquid crystal panel 102 facing each other entirely for example with resin (by what is called glass bonding). The liquid crystal panel 102 glass-bonded to the front member 120 may also be called a "glass-bonded panel." The glass bonding does not generate an air layer between the liquid crystal panel 102 and the front member 120, making it possible to prevent reduction of visibility due to reflection of external light, mixture of a foreign substance, water condensation and the like. The positions of the front member 120 and the liquid crystal panel 102 relative to each other may be fixed by a technique other than the glass bonding.

The first rear member 122 is arranged on a rear surface 102b of the liquid crystal panel 102. Here, the first rear member 122 is a backlight unit to illuminate the liquid crystal panel 102, for example. The first rear member 122 will also be called a backlight unit 122 in some cases. The first rear member 122 is not limited to a backlight unit. If the display member 102 is a plasma display panel that does not require a backlight unit, for example, the first rear member 122 is composed of a panel support member, a heat dissipating member or the like arranged on the rear surface of the panel.

As an example, the backlight unit 122 includes a light source to emit light, a light guide plate to propagate the light emitted from the light source, and a frame 122a housing these elements. Only the exterior appearance of the frame 122a is shown in the drawings. To avoid complication of the drawings, the outer shape of the frame 122a is shown in a simplified manner in the drawings. The outer shape of the frame 122a is not limited to that shown in the drawings. The frame 122a can be manufactured by a resin mold technique, for example. Accordingly, the frame 122a will also be called a molded frame 122a in some cases. The material and the manufacturing method for the frame 122a are not limited to these examples. The frame 122a may also be formed by assembling a plurality of members.

The backlight unit 122 is arranged such that an illumination output side, specifically an opening side of the molded frame 122a faces the liquid crystal panel 102. For the sake of convenience, the side of the backlight unit 122 facing the liquid crystal panel 102 is called a front surface 122b. A surface of the backlight unit 122 opposite the front surface 122b is called a rear surface 122c, and surfaces connecting the front and rear surfaces 122b and 122c are called side surfaces 122d. The rear surface 122c and the side surfaces 122d form outer surfaces of the molded frame 122a. The side surfaces 122d are in a standing posture with respect to the rear surface 102b of the liquid crystal panel 102. A direction of standing of the side surfaces 122d is not limited to that of the example shown in the drawings, specifically a direction normal to the rear surface 102b of the liquid crystal panel 102. The backlight unit 122 will be described in more detail later.

The second rear member 124 has a shape surrounding the side surfaces 122d of the backlight unit 122. The second rear member 124 is attached so as to be fitted to the backlight unit 122 from the rear surface 122c side of the backlight unit 122. The backlight unit 122 is housed in the second rear member 124 in this condition of attachment.

In the display device 100, the second rear member 124 holds the backlight unit 122 and the glass-bonded panel (namely, the liquid crystal panel 102 glass-bonded to the front member 120) integrally. Accordingly, in some cases, the second rear member 124 will also be called an integration holding member 124 or an integrating member 124, for example. However, holding members integrally is not the only function of the second rear member 124. As an example, the second rear member 124 may be a protective member to prevent contact of some object with the backlight unit 122 or the like from a direction of the rear surface of the backlight unit 122, or application of pressure from such an object from the direction of this rear surface.

In the example shown in the drawings, the integrating member 124 includes a surrounding part 124a and a flange part 124b. The surrounding part 124a is arranged around the side surfaces 122d of the backlight unit 122 to house the backlight unit 122. The surrounding part 124a is in a standing posture with respect to the rear surface 102b of the liquid crystal panel 102. The flange part 124b extends from a periphery of an opening of the surrounding part 124a outwardly beyond the surrounding part 124a to face the front member 120.

The integrating member 124 can be manufactured by a pressing technique on a metal thin plate or a resin mold technique, for example. However, they are not the only examples of a material and a manufacturing method for the integrating member 124. The integrating member 124 may also be formed by assembling a plurality of members. The integrating member 124 may include an attachment part (such as a screw part or an attachment hole) for attachment of a casing to a final product.

A cushioned joint member (not shown in the drawings) may be provided between the flange part 124b of the integrating member 124 and the front member 120. The cushioned joint member can be composed of double-coated tape or an adhesive, for example. The cushioned joint member may also be a structure including a cushioned buffer material provided with double-faced tape, an adhesive or the like. As an example, a curable resin provides adhesive force that increases with time. Thus, using such a resin can enhance adhesive properties further. The cushioned joint member may be provided in a different place. As an example, the cushioned joint member may be provided between the liquid crystal panel 102 and the backlight unit 122.

As shown in FIG. 6, the surrounding part 124a of the integrating member 124 faces the side surface 122d of the backlight unit 122, and the interconnect member 114 extends between the surrounding part 124a and the side surface 122d. As shown in FIGS. 4 to 6, an insertion part 122e is formed in the side surface 122d of the backlight unit 122. An end portion 114a (specifically, a portion away from the liquid crystal panel 102) of the interconnect member 114 is inserted in the insertion part 122e.

A condition where the interconnect member 114 is inserted in the backlight unit 122 is formed before attachment of the integrating member 124, and is maintained after attachment of the integrating member 124. More specifically, a step of arranging the backlight unit 122 on the liquid crystal panel 102 to which the interconnect member 114 and the like are connected is performed. Then, a step of inserting the end portion 114a of the interconnect member 114 into the insertion part 122e of the backlight unit 122 is performed. After the step of insertion, a step of attaching the integrating member 124 is performed such that the integrating member 124 is attached from the rear surface 122c side of the backlight unit 122 so as to house the backlight unit 122 and the interconnect member 114. The condition where the interconnect member 114 is inserted in the backlight unit 122 is maintained after the step of attaching the integrating member 124. This prevents the interconnect member 114 from getting snagged on the integrating member 124 during attachment of the integrating member 124.

Figure 7:
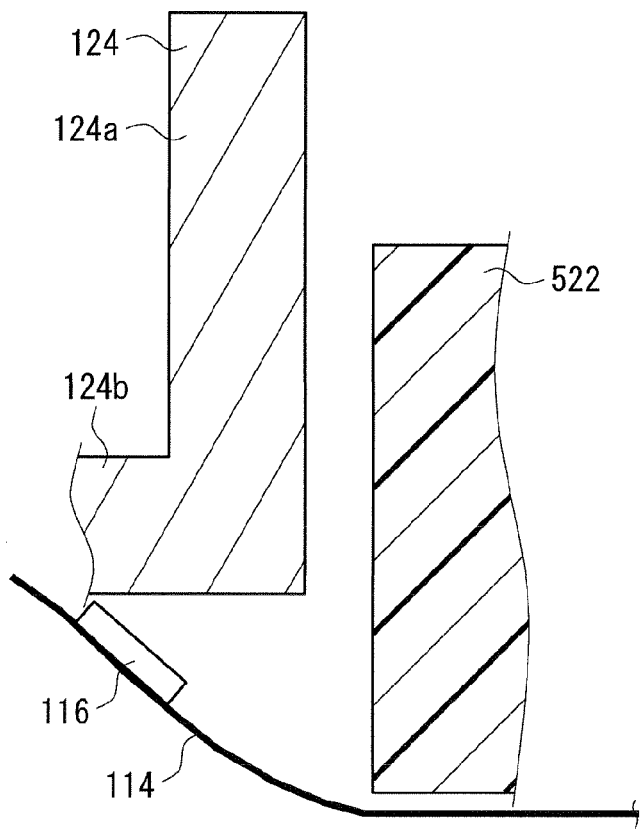
FIG. 7 is a sectional view showing a comparative example.

From an opposite point of view, in the case of a backlight unit 522 not including the insertion part 122e shown as a comparative example in FIG. 7, the interconnect member 114 gets snagged on the integrating member 124 to reduce working efficiency. If the interconnect member 114 is caught between the integrating member 124 and the front member 120, the interconnect member 114, the integrating member 124, or the front member 120 may be damaged.

In the comparative example of FIG. 7, it might be possible to prevent the interconnect member 114 from getting snagged on the integrating member 124 if the interconnect member 114 is bonded to the backlight unit 522 with an adhesive member such as tape. However, this involves cost for the adhesive member. Further, handling the adhesive member might reduce working efficiency. In contrast, the condition where the interconnect member 114 is inserted in the backlight unit 122 is maintained during attachment of the integrating member 124, making it possible to avoid the various factors of productivity decline mentioned relating to the comparative example.

The condition where the interconnect member 114 is inserted in the backlight unit 122 is still maintained after attachment of the integrating member 124. This prevents shake of the interconnect member 114 and the IC 116 during transport of the display device 100, for example. Preventing this shake also prevents collision of the interconnect member 114 and the IC 116 with the backlight unit 122 or the integrating member 124, for example. This prevents damage on the interconnect member 114 or the like.

A structure where the interconnect member 114 is inserted in the backlight unit 122 further works effectively in disassembling the display device 100 for repair, for example. More specifically, in the comparative example of FIG. 7, if the interconnect member 114 is held on the backlight unit 522 with an adhesive member, a mounting portion of the interconnect member 114 might be disconnected during removal of the adhesive member. In contrast, the structure where the interconnect member 114 is inserted in the backlight unit 122 allows the interconnect member 114 to be released from its held condition easily by taking out the interconnect member 114 with tweezers, for example. This prevents the aforementioned disconnection of the interconnect member 114, making it possible to provide a structure that can be disassembled and repaired easily.

As shown in the example of FIGS. 5 and 6, the insertion part 122e formed in the backlight unit 122 is composed of a recessed part 122f and a canopy part 122g. The recessed part 122f is provided inside the molded frame 122a of the backlight unit 122, and is continuous with an opening of the insertion part 122e in the side surface 122d. As a result, the recessed part 122f provides space for housing the end portion 114a of the interconnect member 114. The canopy part 122g overhangs above the recessed part 122f and forms the opening of the insertion part 122e. Specifically, the canopy part 122g narrows an opening of the recessed part 122f and this narrowed opening corresponds to the opening of the insertion part 122e.

The canopy part 122g is provided such that, even if the end portion 114a of the interconnect member 114 moves in a direction of the depth of the recessed part 122f (horizontal direction of the drawings), the end portion 114a of the interconnect member 114 is prohibited from falling from the recessed part 122f. More specifically, in the example of FIGS. 4 to 6, the canopy part 122g covers part of the opening of the recessed part 122f away from the liquid crystal panel 102 (see FIG. 3). As a result, the opening of the insertion part 122e is defined in part of the recessed part 122f near the liquid crystal panel 102. This prevents the end portion 114a from falling from the recessed part 122f, even if the interconnect member 114 moves relative to its part where the interconnect member 114 is bent. As a result, the aforementioned effects including enhancement of productivity are achieved more reliably.

The shape and size of the opening of the insertion part 122e are required to allow insertion of the end portion 114a of the interconnect member 114. More specifically, the opening width of the insertion part 122e is required not to fall below the width of the interconnect member 114, and the opening height of the insertion part 122e is required not to fall below the thickness of the interconnect member 114. More preferably, the opening width of the insertion part 122e is determined in consideration of variations of positions where the interconnect member 114, the backlight unit 122 and the like are arranged. The opening width of the insertion part 122e and the width of the interconnect member 114 are dimensions determined in a direction parallel to the rear surface 102b of the liquid crystal panel 102. The opening height of the insertion part 122e and the thickness of the interconnect member 114 are dimensions determined in a direction normal to the rear surface 102b of the liquid crystal panel 102.

In the example of FIG. 6, the opening of the insertion part 122e has a shape and a size that allow the IC 116 on the interconnect member 114 to enter and exit the insertion part 122e while the interconnect member 114 is inserted in the backlight unit 122. This allows the IC 116 to retract into the insertion part 122e even if the integrating member 124 and the interconnect member 114 contact each other during attachment of the integrating member 124. As a result, damage on the IC 116 is prevented. This effect is achieved more reliably if the depth of the insertion part 122e (specifically, the depth of the recessed part 122f) does not fall below the height of the IC 116.

In the example of FIG. 6, the IC 116 is mounted on a surface of the interconnect member 114 facing the backlight unit 122. This prevents the IC 116 from contacting the integrating member 124 directly, even if the integrating member 124 and the interconnect member 114 contact each other during attachment of the integrating member 124. This also allows the IC 116 to retract into the insertion part 122e easily. As a result, damage on the IC 116 is prevented.

Figure 8:
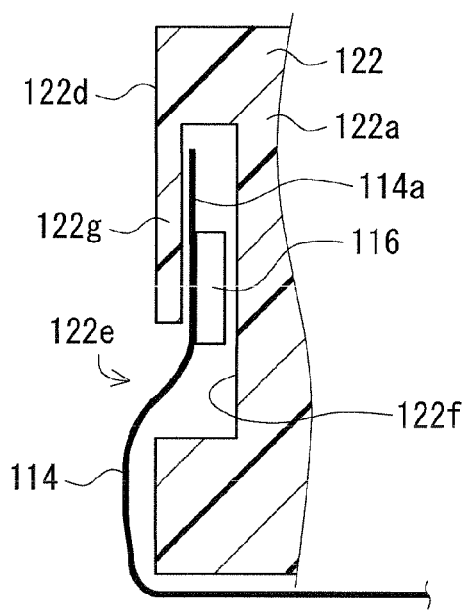
FIG. 8 is a sectional view schematically showing the display device of the first preferred embodiment.

As shown in the example of FIG. 8, the IC 116 may be housed, together with the end portion 114a of the interconnect member 114, in the insertion part 122e. As in the aforementioned case, this prevents damage on the IC 116, even if the integrating member 124 and the interconnect member 114 contact each other during attachment of the integrating member 124.

Second Preferred Embodiment

Figure 9:
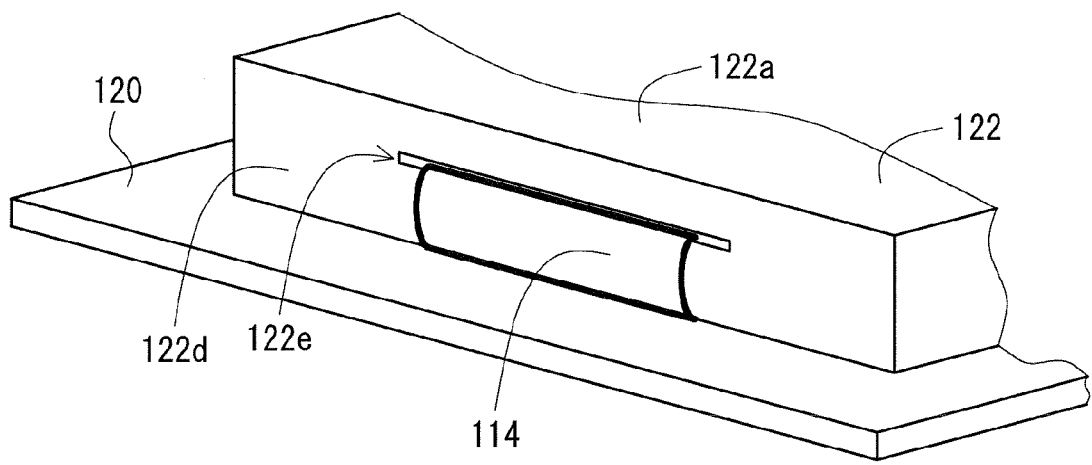
FIG. 9 is a perspective view schematically showing a display device of a second preferred embodiment.
Figure 10:
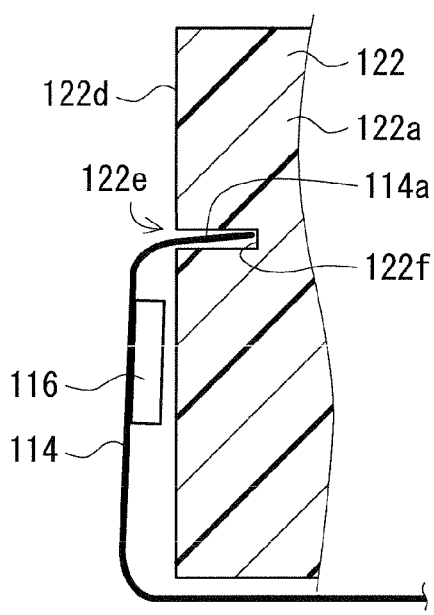
FIGS. 10 and 11 are sectional views each schematically showing the display device of the second preferred embodiment.
Figure 11:
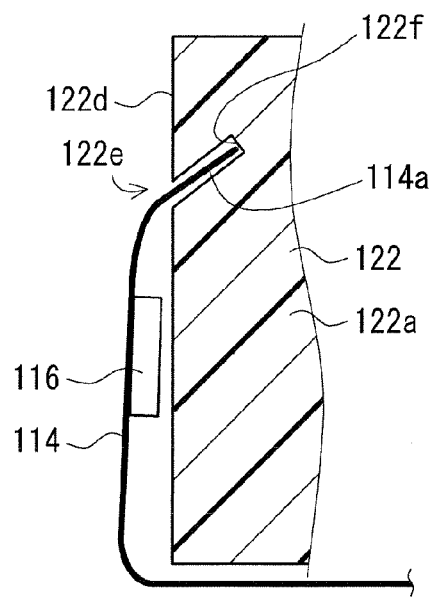

FIGS. 9 to 11 schematically show a display device 100 of a second preferred embodiment. FIGS. 9 to 11 show parts extracted from the display device 100 of the second preferred embodiment: FIG. 9 is a perspective view, and FIGS. 10 and 11 are sectional views. Basically, the display device 100 of the second preferred embodiment has the same structure as that of the first preferred embodiment and is manufactured by the same method as that of the first preferred embodiment, while the structure of the insertion part 122e of the backlight unit 122 is different from that of the first preferred embodiment.

In the example of FIGS. 9 to 11, the insertion part 122e of the backlight unit 122 does not include the canopy part 122g (see FIG. 6) so that it is composed only of the recessed part 122f. In particular, the recessed part 122f has the shape of a groove formed as a slit opening in the side surface 122d of the backlight unit 122. The recessed part 122f of such a groove shape is called a groove part 122f.

The depth direction of the groove part 122f can be determined arbitrarily. As an example, the groove part 122f of FIG. 10 has a depth in a direction perpendicular to the side surface 122d of the backlight unit 122. In the example of FIG. 11, the depth direction of the groove part 122f is tilted at 45 degrees relative to the side surface 122d of the backlight unit 122.

The insertion part 122e of a groove shape without the canopy part 122g (see FIG. 6) can still prohibit the end portion 114a of the interconnect member 114 from falling from the insertion part 122e. As an example, if the interconnect member 114 has flexibility that allows the interconnect member 114 to maintain its standing posture (see the conditions of FIGS. 10 and 11) by itself, the interconnect member 114 is prevented from falling from the insertion part 122e. As another example, when the interconnect member 114 is bent by being inserted into the insertion part 122e, the resilience of the interconnect member 114 generates force that makes the interconnect member 114 try to become flattened. This force presses the interconnect member 114 against the inner wall surface of the insertion part 122e, thereby preventing falling from the insertion part 122e.

Determining the depth of the insertion part 122e of a groove shape also contributes to prevention of falling of the interconnect member 114. More specifically, the interconnect member 114 cannot be placed in a standing posture satisfactorily with the shallow insertion part 122e to make the interconnect member 114 tilt. This tilt generates force in a direction that pulls the interconnect member 114 out of the insertion part 122e. Accordingly, a sufficient groove depth of the insertion part 122e can control the amount of insertion of the interconnect member 114, so that the standing posture of the interconnect member 114 can be controlled. This prevents falling of the interconnect member 114.

Determining the opening height (namely, slit width) of the insertion part 122e also contributes to prevention of falling of the interconnect member 114. More specifically, reducing the opening height of the insertion part 122e reduces a range of movement of the interconnect member 114 in the insertion part 122e, so that the interconnect member 114 is unlikely to fall off. Thus, the opening height of the insertion part 122e is preferably determined in consideration of working efficiency in a step of inserting the interconnect member 114, for example.

By employing the insertion part 122e of a groove shape, the IC 116 is placed outside the backlight unit 122, as shown in FIGS. 10 and 11. As a result, the IC 116 can be placed in a favorable heat dissipation environment. If the interconnect member 114 contacts the integrating member 124 (see FIGS. 1 and 6, for example) while the integrating member 124 is already attached, the integrating member 124 is usable as a heat dissipation member. Specifically, heat generated in the IC 116 can be transferred to the integrating member 124 via the interconnect member 114, and then can be dissipated from the integrating member 124.

The structure of the second preferred embodiment further achieves the same effects as those of the first preferred embodiment.

Third Preferred Embodiment

Figure 12:
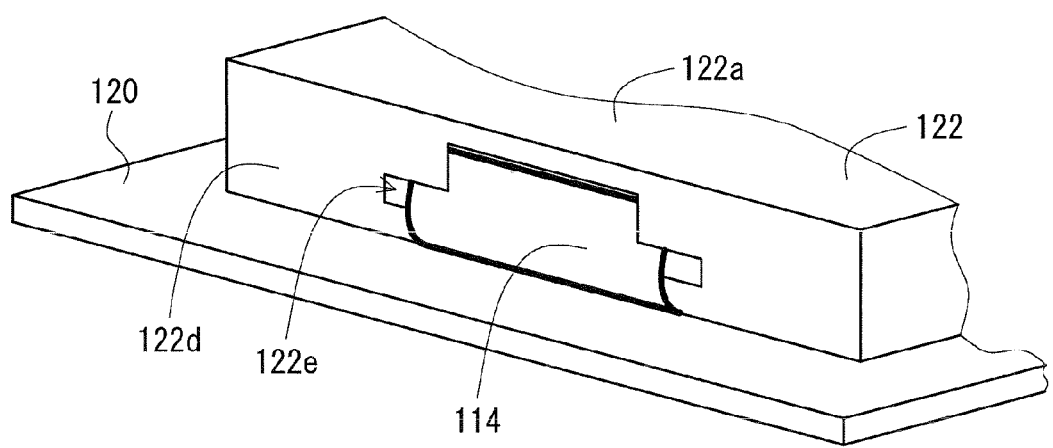
FIG. 12 is a perspective view schematically showing a display device of a third preferred embodiment.
Figure 13:
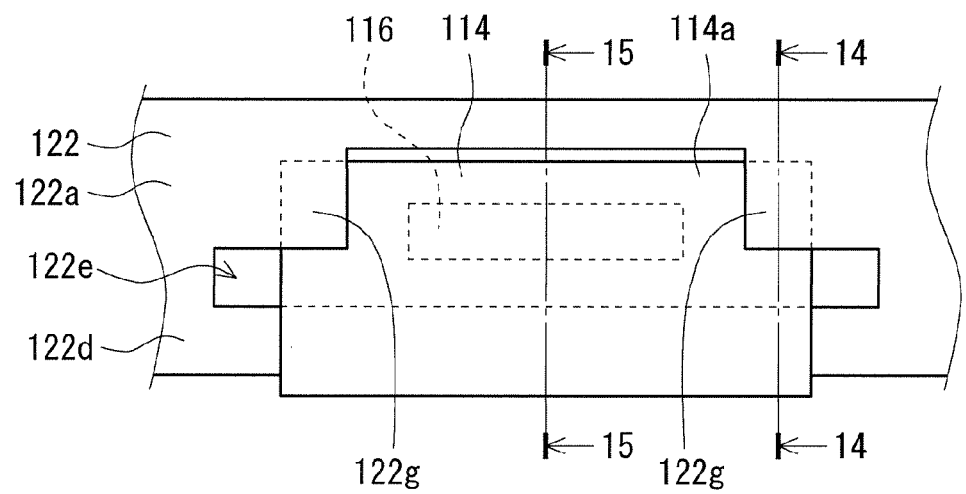
FIG. 13 is a side view schematically showing the display device of the third preferred embodiment.
Figure 14:
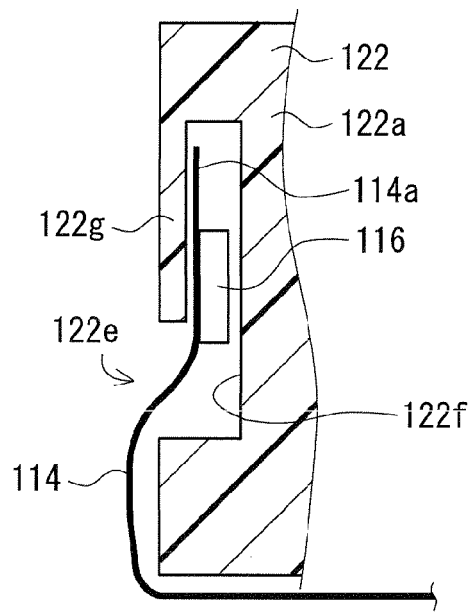
FIG. 14 is a sectional view taken along line 14-14 of FIG. 13.
Figure 15:
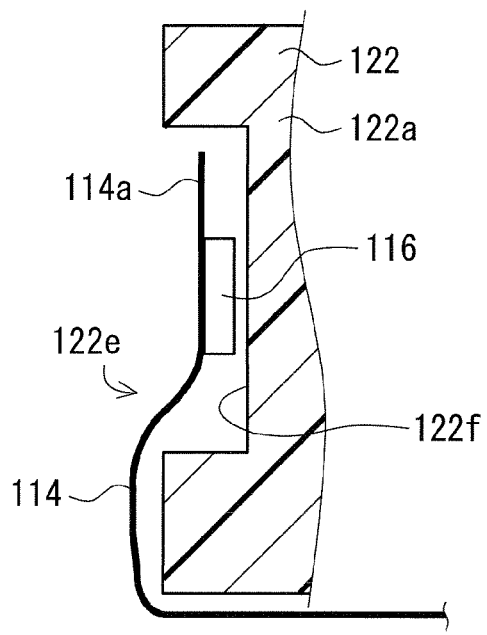
FIG. 15 is a sectional view taken along line 15-15 of FIG. 13.

FIGS. 12 to 15 schematically show a display device 100 of a third preferred embodiment. FIGS. 12 to 15 show parts extracted from the display device 100 of the third preferred embodiment: FIG. 12 is a perspective view, FIG. 13 is a side view, and FIGS. 14 and 15 are sectional views taken along line 14-14 and line 15-15 of FIG. 13 respectively. Basically, the display device 100 of the third preferred embodiment has the same structure as that of the first preferred embodiment and is manufactured by the same method as that of the first preferred embodiment, while the structure of the insertion part 122e of the backlight unit 122 is different from that of the first preferred embodiment.

In the example of FIGS. 12 to 15, like that of the first preferred embodiment, the insertion part 122e of the backlight unit 122 is composed of the recessed part 122f and the canopy part 122g. Further, the canopy part 122g is provided at each corner area of the opening of the recessed part 122f away from the liquid crystal panel 102. Thus, the canopy part 122g overlaps a corner area of the end portion 114a of the interconnect member 114 housed in the recessed part 122f while it does not overlap a central part of this end portion 114a. This arrangement of the canopy part 122g can still prohibit the end portion 114a of the interconnect member 114 from falling from the recessed part 122f.

The aforementioned arrangement of the canopy part 122g makes the opening of the insertion part 122e extend further toward a direction away from the liquid crystal panel 102, so that the end portion 114a of the interconnect member 114 is viewed through the opening of the insertion part 122e. Thus, the interconnect member 114 is taken out from the insertion part 122e more easily than from the insertion part 122e of the first preferred embodiment. Depending on the size of the opening of the insertion part 122e, the interconnect member 114 can be taken out with fingers without using tweezers, for example. As a result, the display device 100 of the third preferred embodiment can be disassembled and repaired more easily than that of the first preferred embodiment.

Figure 16:
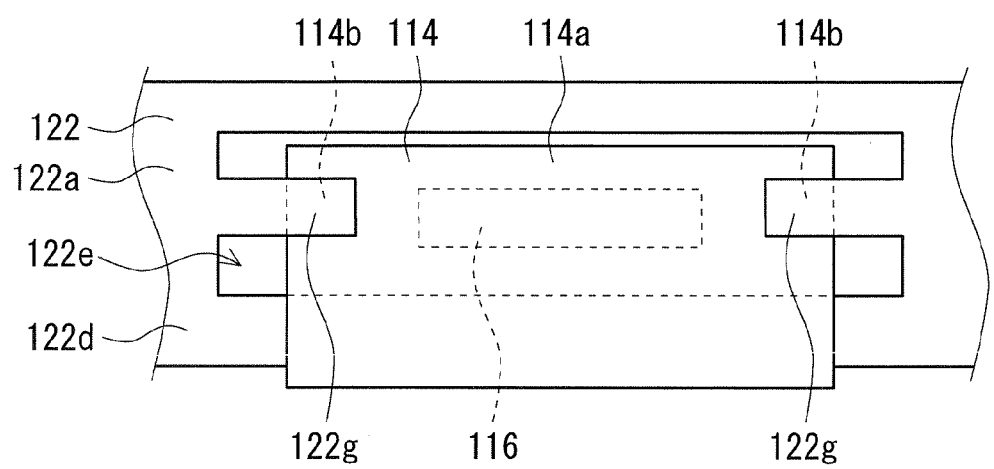
FIG. 16 is a side view schematically showing the display device of the third preferred embodiment.

The side view of FIG. 16 shows an example where the canopy part 122g is provided so as to overlap only a lateral part 114b of the interconnect member 114. This example achieves the same effects as those described above.

The structure of the third preferred embodiment further achieves the same effects as those of the first preferred embodiment.

Fourth Preferred Embodiment

FIGS. 17 and 18 schematically show a display device 100 of a fourth preferred embodiment. FIGS. 17 and 18 show parts extracted from the display device 100 of the fourth preferred embodiment: FIG. 17 is a sectional view, and FIG. 18 is a plan view. Basically, the display device 100 of the fourth preferred embodiment has the same structure as that of the first preferred embodiment and is manufactured by the same method as that of the first preferred embodiment, while the structure of the insertion part 122e of the backlight unit 122 and the structure of the interconnect member 114 are different from these of the first preferred embodiment.

As shown in FIG. 17, the insertion part 122e of the backlight unit 122 includes a recessed part 122f and a canopy part 122g corresponding to those of the first preferred embodiment and additionally, includes a first coupling part 122h. As shown in FIGS. 17 and 18, the interconnect member 114 includes a second coupling part 114c. While the interconnect part 114 is inserted in the insertion part 122e, the coupling parts 122h and 114c are coupled together.

More specifically, in the example of FIGS. 17 and 18, the coupling part 122h of the insertion part 122e is composed of a pin projection, and is provided on an inner surface of the canopy part 122g (surface facing the bottom surface of the recessed part 1220. Accordingly, the coupling part 122h will also be called a pin projection 122h in some cases. The coupling part 114c of the interconnect member 114 is composed of a hole in which the coupling part 122h of the insertion part 122e can be inserted. Accordingly, the coupling part 114c will also be called a hole 114c in some cases. In the example of FIGS. 17 and 18, the hole 114c is provided at each corner area of the end portion 114a of the interconnect member 114, and the pin projection 122h is arranged in a position corresponding to the hole 114c.

When the interconnect member 114 is inserted into the insertion part 122e, the hole 114c of the interconnect member 114 and the pin projection 122h of the insertion part 122e can be coupled together by hooking the pin projection 122h in the hole 114c. This coupling can more reliably maintain the condition where the interconnect member 114 is inserted in the insertion part 122e.

Figure 19:
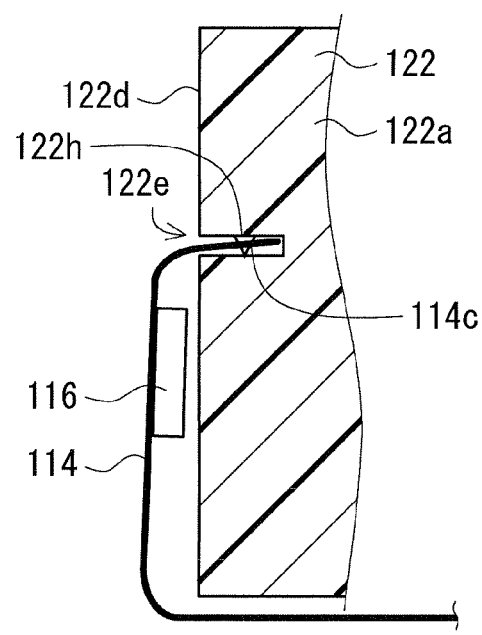
FIG. 19 is a sectional view schematically showing the display device of the fourth preferred embodiment.

Coupling between the pin projection 122h and the hole 114c is also applicable to the structures of the second and third preferred embodiments. FIG. 19 shows an example where the pin projection 122h and the hole 114c are applied to the structure of FIG. 10. In the example of FIG. 19, the pin projection 122h is provided on the upper surface (surface away from the liquid crystal panel 102) of the recessed part 122f of the insertion part 122e.

The respective shapes of the coupling parts 122h and 114c, the respective positions of the coupling parts 122h and 114c, the number of the coupling parts 122h, and the number of the coupling parts 114c are not limited to those of the aforementioned example.

The structure of the fourth preferred embodiment further achieves the same effects as those of the first preferred embodiment.

Fifth Preferred Embodiment

In the examples shown in the first to fourth preferred embodiments, the insertion part 122e is formed in the molded frame 122a of the backlight unit 122. If the frame 122a is manufactured by a resin mold technique, the insertion part 122e can be formed into various shapes.

Figure 20:
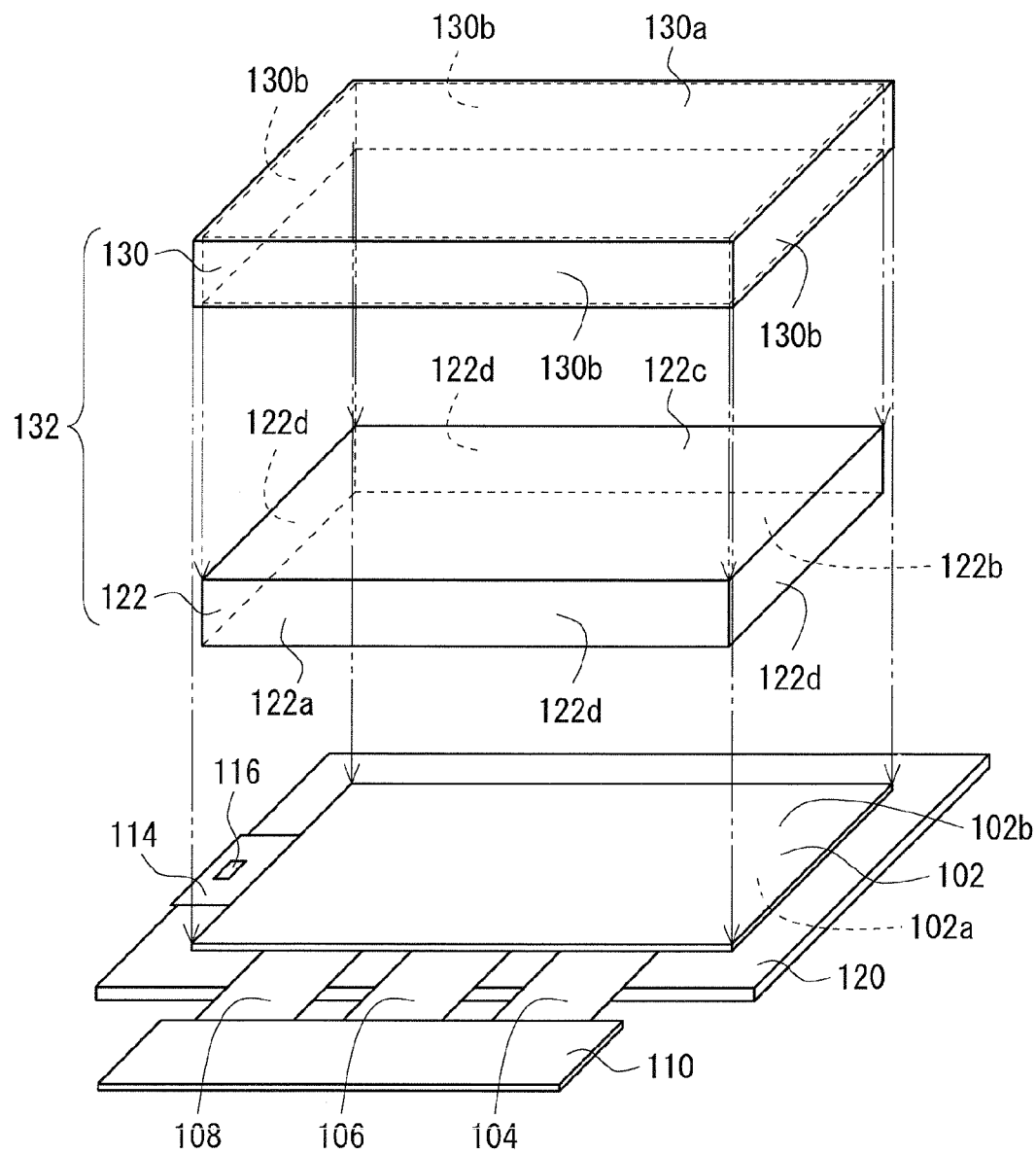
FIG. 20 is an exploded perspective view schematically showing a display device of a fifth preferred embodiment.
Figure 21:
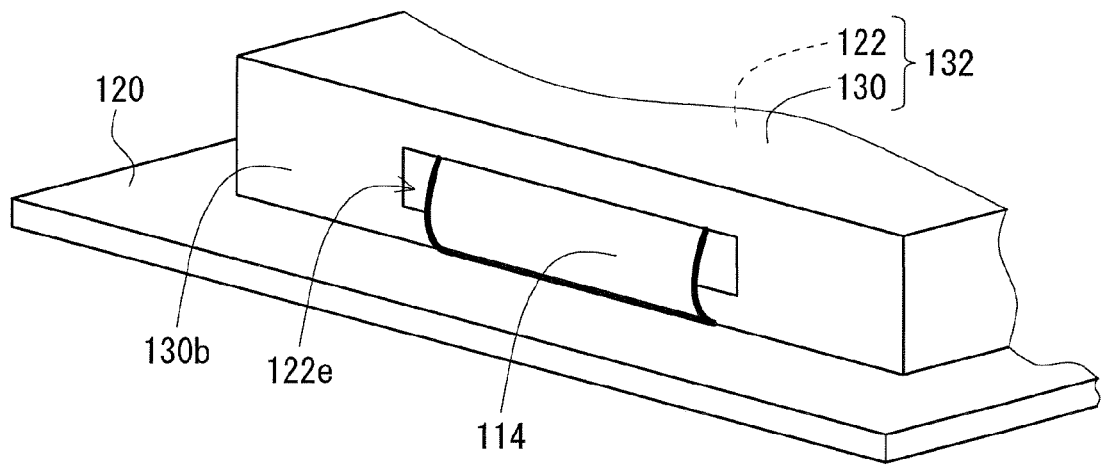
FIG. 21 is a perspective view schematically showing the display device of the fifth preferred embodiment.
Figure 22:
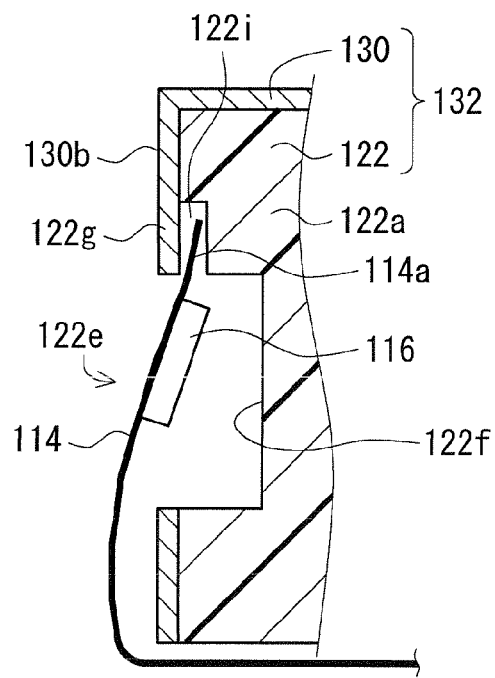
FIGS. 22 and 23 are sectional views each schematically showing the display device of the fifth preferred embodiment.

The insertion part 122e may also be formed by assembling a plurality of members. A fifth preferred embodiment describes an example of such formation. FIGS. 20 to 22 schematically show a display device 100 of the fifth preferred embodiment. FIGS. 20 to 22 show parts extracted from the display device 100 of the fifth preferred embodiment: FIG. 20 is an exploded perspective view, FIG. 21 is a perspective view, and FIG. 22 is a sectional view.

As shown in FIGS. 20 to 22, in the display device 100 of the fifth preferred embodiment, a first rear member 132 is composed of the backlight unit 122 and a rear frame 130. Except for this, the display device 100 of the fifth preferred embodiment basically has the same structure as that of the first preferred embodiment and is manufactured by the same method as that of the first preferred embodiment.

The rear frame 130 is coupled to the backlight unit 122 to support the backlight unit 122. In the example shown in the drawings, the rear frame 130 has a shape that covers the molded frame 122a of the backlight unit 122 from the rear surface 122c side thereof. In this example, the rear frame 130 is manufactured by a pressing technique on a metal thin plate. The rear frame 130 may also be manufactured by a resin mold technique, for example.

The rear frame 130 has a rear surface 130a and side surfaces 130b corresponding to the rear surface 122c and the side surfaces 122d respectively of the molded frame 122a (namely, of the backlight unit 122). While the rear frame 130 is attached to the backlight unit 122, the rear surface 130a and the side surfaces 130b of the rear frame 130 form the rear surface and the side surfaces of the first rear member 132.

Accordingly, the rear surface and the side surfaces of the first rear member 132 are also identified by reference numbers 130a and 130b respectively.

The interconnect members 104, 106 and 108 are bent to place the circuit board 110 on the rear surface 130a of the rear frame 130 (see FIG. 1).

As shown in FIGS. 21 and 22, the insertion part 122e is provided in the side surface 130b of the first rear member 132. In the example of FIG. 22, the canopy part 122g of the insertion part 122e is composed of the rear frame 130, and the recessed part 122f of the insertion part 122e is composed of the molded frame 122a.

The shape of the recessed part 122f can be the same as that of the first preferred embodiment (see FIG. 6). Meanwhile, in the example of FIG. 22, part of the recessed part 122f facing the canopy part 122g is narrowed. As a result, a narrowed spatial area 122i is formed in part of the insertion part 122e away from the liquid crystal panel 102 so as to extend parallel to the side surface 130b of the first rear member 132. In the example of FIG. 22, the end portion 114a of the interconnect member 114 is inserted in the narrowed spatial area 122i. The thickness of the narrowed spatial area 122i (dimension in the depth direction of the recessed part 122f) is from about 0.2 mm to 0.5 mm, for example.

The shape and size of the opening of the insertion part 122e may be determined in the same way as in the first preferred embodiment, for example. The depth of a deep portion of the recessed part 122f may also be determined in the same way as in the first preferred embodiment.

The structure where the insertion part 122e is composed of the two members 122 and 130 still achieves the same effects as those of the first preferred embodiment. A structure where the insertion part 122e is composed of more members also achieves the same effects as those of the first preferred embodiment. In particular, using a plurality of members for forming the insertion part 122e can form the insertion part 122e into a variety of shapes. As an example, the shape of the insertion part 122e with the narrowed spatial area 122i shown in the example of FIG. 22 requires a high-level technique if it is to be formed with a resin mold. However, assembling a plurality of members can easily form the insertion part 122e with the narrowed spatial area 122i.

Figure 23:
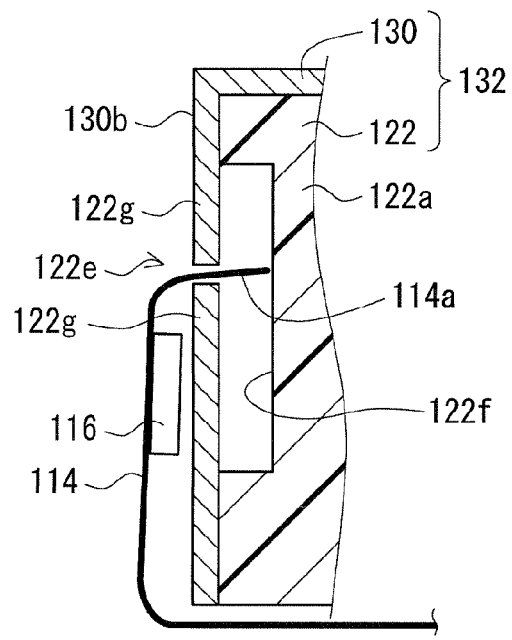

The sectional view of FIG. 23 shows an example where an opening of the insertion part 122e is formed as a slit and the interior of the insertion part 122e extends more extensively than the slit opening. This also requires a high-level technique if the insertion part 122e is to be formed with a resin mold. However, assembling a plurality of members can form the insertion part 122e of this shape easily. More specifically, as shown in the example of FIG. 23, if the recessed part 122f is composed of the molded frame 122a of the backlight unit 122, the canopy part 122g is composed of the rear frame 130, and the amount of the overhang of the canopy part 122g is determined, the slit opening and the interior space extending more extensively than the slit opening can be formed easily.

In the example of FIG. 23, the IC 116 is arranged outside the first rear member 132, thereby achieving the same effects as those of the third preferred embodiment.

Figure 24:
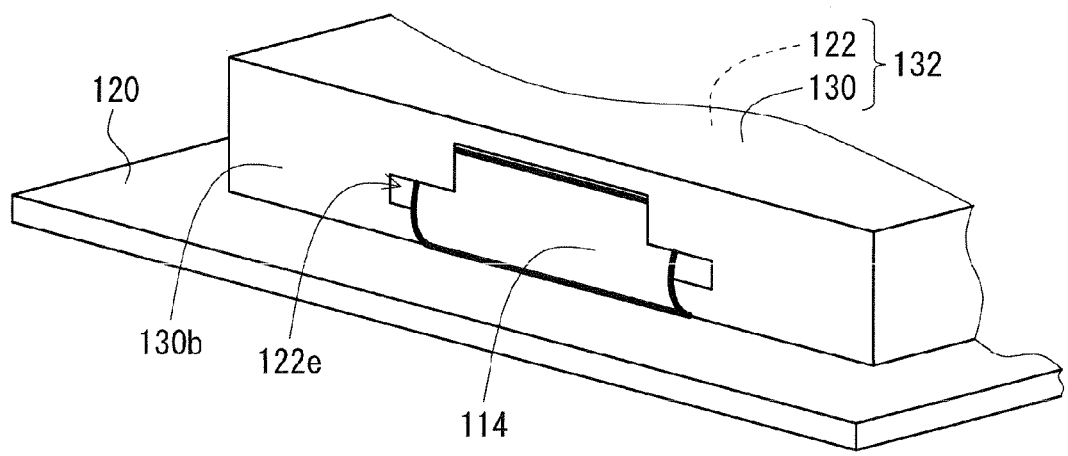
FIG. 24 is a perspective view schematically showing the display device of the fifth preferred embodiment.
Figure 25:
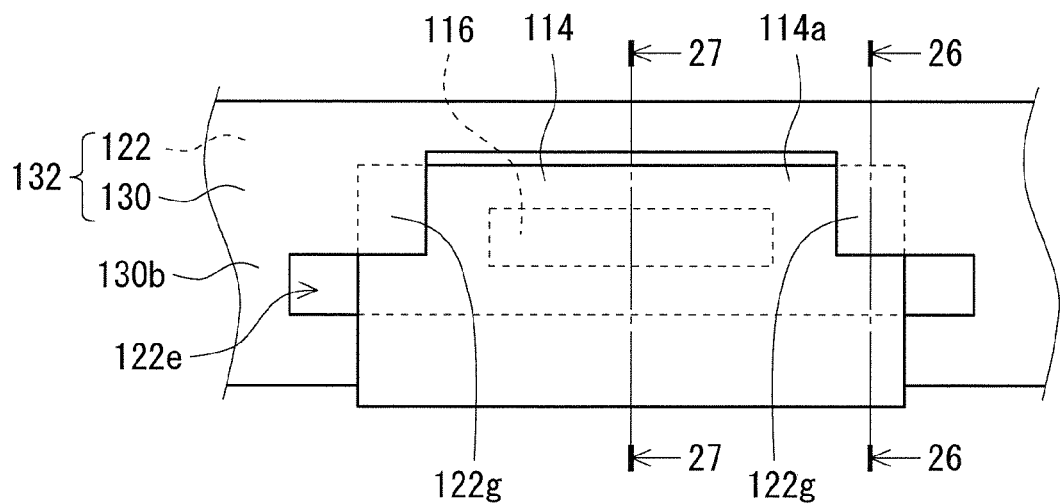
FIG. 25 is a side view schematically showing the display device of the fifth preferred embodiment.
Figure 26:
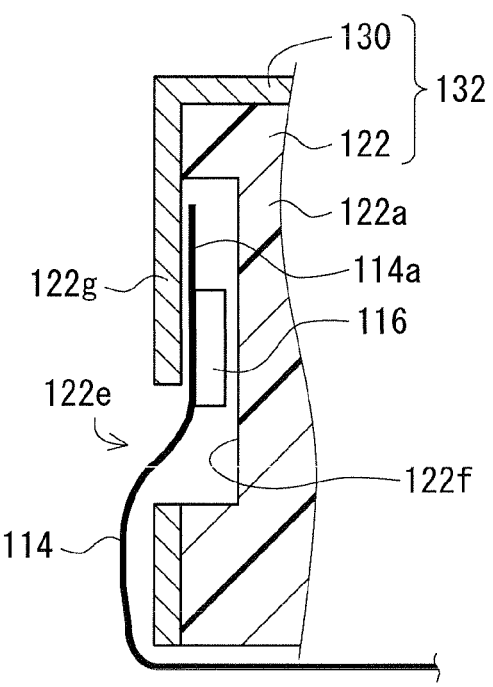
FIG. 26 is a sectional view taken along line 26-26 of FIG. 25.
Figure 27:
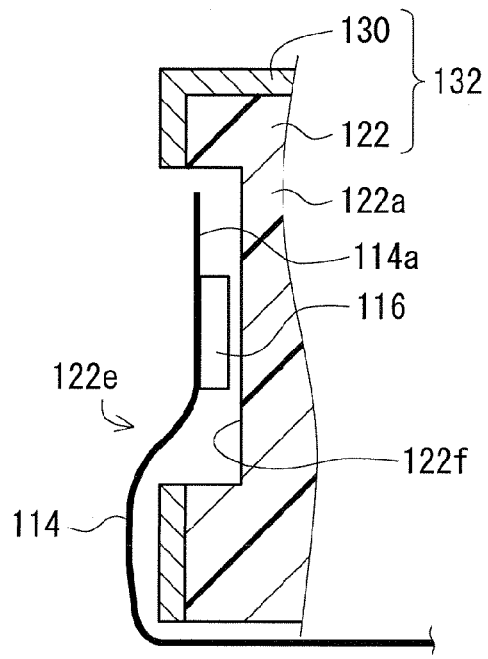
FIG. 27 is a sectional view taken along line 27-27 of FIG. 25.

The insertion part 122e of each of the second and third preferred embodiments can also be composed of a plurality of members. FIGS. 24 to 27 show an example of such a structure where the insertion part 122e of the third preferred embodiment is formed in the first rear member 132 composed of the backlight unit 122 and the rear frame 130. FIGS. 24 to 27 show parts extracted from the display device 100: FIG. 24 is a perspective view, FIG. 25 is a side view, and FIGS. 26 and 27 are sectional views taken along line 26-26 and line 27-27 of FIG. 25 respectively.

In the example shown in FIGS. 24 to 27, the canopy part 122g of the insertion part 122e is composed of the rear frame 130, and the recessed part 122f of the insertion part 122e is composed of the molded frame 122a of the backlight unit 122. This insertion part 122e also achieves the aforementioned effects brought about by the structure of the insertion part 122e composed of a plurality of members. This insertion part 122e further achieves the same effects as those of the third preferred embodiment.

Sixth Preferred Embodiment

Figure 28:
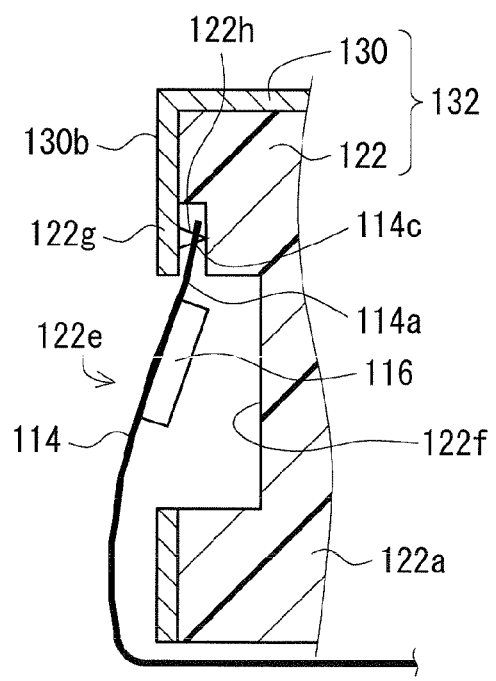
FIGS. 28 and 29 are sectional views each schematically showing a display device of a sixth preferred embodiment.
Figure 29:
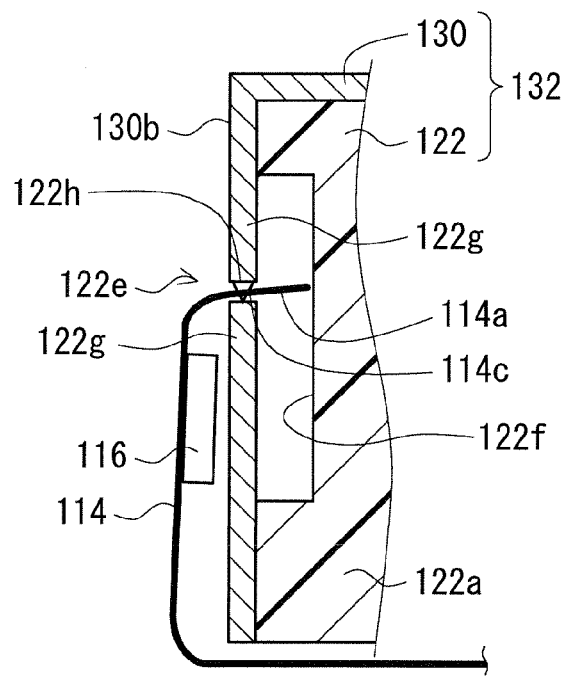

The coupling parts 122h and 114c of the fourth preferred embodiment are also applicable to the structure of the fifth preferred embodiment. As a result, the effects of the fourth and fifth preferred embodiments are achieved. FIGS. 28 and 29 show examples where the coupling parts 122h and 114c are applied to the structures of FIGS. 22 and 23 respectively. In the examples of FIGS. 28 and 29, the coupling part 122h is provided in the rear frame 130.

Modifications

The preferred embodiments of the present invention can be combined freely, and each of the preferred embodiments can be modified or omitted where appropriate without departing from the scope of the invention.

By way of example, the respective shapes, materials and the like for the display member 102, the first rear members 122 and 132, the second rear member 124, the interconnect member 114, the insertion part 122e and the like are not limited to those shown in the aforementioned examples.

The present invention is also applicable to a structure without the mounted element 116, for example. In this case, the interconnect member 114 is usable as a member to pull lines in the liquid crystal panel 102 out of the liquid crystal panel 102 and interconnect the pulled out lines. As an example, this can change the connection between the lines inside the panel easily according to the interconnect pattern of the interconnect member 114.

The present invention is also applicable to a structure without the front member 120, for example.

While the invention has been shown and described in detail, the foregoing description is in all aspects illustrative and not restrictive. It is therefore understood that numerous modifications and variations can be devised without departing from the scope of the invention.

What is claimed is:

1. A display device, comprising:
   a display member;
   a first rear member arranged on a rear surface of said display member, said first rear member including a single piece body having a top surface, a rear surface opposing said top surface, and an outer side surface extending between said top surface and said rear surface;
   a second rear member having a shape surrounding said outer side surface of said first rear member, said second rear member being attached from said rear surface side of said first rear member to house said first rear member; and
   an interconnect member connected to said display member, wherein said interconnect member extends between said outer side surface of said first rear member and said second rear member, an end portion of said interconnect member is inserted in an insertion part having an opening formed in said outer side surface of said first rear member, said end portion being away from said display member, and a condition where said interconnect member is inserted in said first rear member is maintained before and after attachment of said second rear member.

2. The display device according to claim 1, wherein said insertion part includes a recessed part provided in said first rear member and continuous with said opening of said insertion part, and a canopy part overhanging above said recessed part and forming said opening of said insertion part, and said canopy part is provided so as to prohibit falling of said end portion of said interconnect member from said recessed part due to movement of said end portion in a direction of the depth of said recessed part.

3. The display device according to claim 2, wherein said opening of said insertion part extends toward a direction away from said display member such that said end portion of said interconnect member is viewed through said opening.

4. The display device according to claim 1, wherein said insertion part includes a groove part in the shape of a slit opening formed in said outer side surface of said first rear member.

5. The display device according to claim 1, wherein said insertion part includes a first coupling part formed inside said first rear member, and said interconnect member includes a second coupling part to be coupled to said first coupling part.

6. The display device according to claim 1, wherein said insertion part is composed of a plurality of members.

7. The display device according to claim 1, further comprising an element mounted on said interconnect member, wherein said opening of said insertion part allows said element to enter and exit said insertion part while said interconnect member is inserted in said first rear member.

8. The display device according to claim 1, further comprising an element mounted on said interconnect member, wherein said element and said end portion of said interconnect member are housed together in said insertion part.

9. The display device according to claim 1, further comprising an element mounted on said interconnect member, wherein said element is arranged outside said first rear member.

10. The display device according to claim 1, further comprising an element mounted on said interconnect member, wherein said element is arranged on a surface of said interconnect member facing said first rear member.

11. The display device according to claim 1, further comprising a front member arranged on a front surface of said display member, wherein said front member includes at least one of a touch panel and a protective member.

12. A method of manufacturing a display device, the display device including a display member, a first rear member arranged on a rear surface of said display member, said first rear member including a single piece body having a top surface, a rear surface opposing said top surface, and an outer side surface extending between said top surface and said rear surface, a second rear member having a shape surrounding said outer side surface of said first rear member, said second rear member being attached from said rear surface side of said first rear member to house said first rear member; and an interconnect member connected to said display member, wherein said interconnect member extends between said outer side surface of said first rear member and said second rear member, an end portion of said interconnect member is inserted in an insertion part having an opening formed in said outer side surface of said first rear member, said end portion being away from said display member, and a condition where said interconnect member is inserted in said first rear member is maintained before and after attachment of said second rear member, the method comprising the steps of:

(a) arranging said first rear member on said display member to which said interconnect member is connected;

(b) inserting said end portion of said interconnect member into said insertion portion of said first rear member; and (c) after said step (b), attaching said second rear member from said rear surface side of said first rear member such that said second rear member houses said first rear member and said interconnect member.

* * * * *